(12) United States Patent
Kraus

(10) Patent No.: US 8,263,880 B2
(45) Date of Patent: Sep. 11, 2012

(54) ASSEMBLY COMPRISING ELECTRIC AND/OR ELECTRONIC COMPONENTS

(76) Inventor: Hilmar Kraus, Frankfurt am Main (DE)

( * ) Notice: Subject to any disclaimer, the term of this patent is extended or adjusted under 35 U.S.C. 154(b) by 176 days.

(21) Appl. No.: 12/473,222

(22) Filed: May 27, 2009

(65) Prior Publication Data

US 2009/0296355 A1   Dec. 3, 2009

(30) Foreign Application Priority Data

Nov. 27, 2006   (DE) .......................... 10 2006 056 258
Jun. 5, 2008   (DE) .......................... 11 2007 001846

(51) Int. Cl.
   *H05K 7/02*   (2006.01)

(52) U.S. Cl. ............. 174/541; 174/64; 174/59; 174/60; 174/548; 174/50; 439/579

(58) Field of Classification Search .................. 174/541, 174/64, 59, 60, 548, 50; 439/579
See application file for complete search history.

(56) References Cited

U.S. PATENT DOCUMENTS 4,956,561 A * 9/1990 Tamer .......................... 307/10.1

FOREIGN PATENT DOCUMENTS

GB   2161906 A * 1/1986

* cited by examiner

*Primary Examiner* — Dhirubhai R Patel

(57) ABSTRACT

A module of electric and/or electronic components, wherein the module is cast with a curable electrically insulating casting material in a housing, characterized in that at least one terminal extending at least slightly into the housing and remaining accessible from outside the housing is provided on the housing, is electrically connected to the module, and is cast together with the module from the inside.

14 Claims, 4 Drawing Sheets

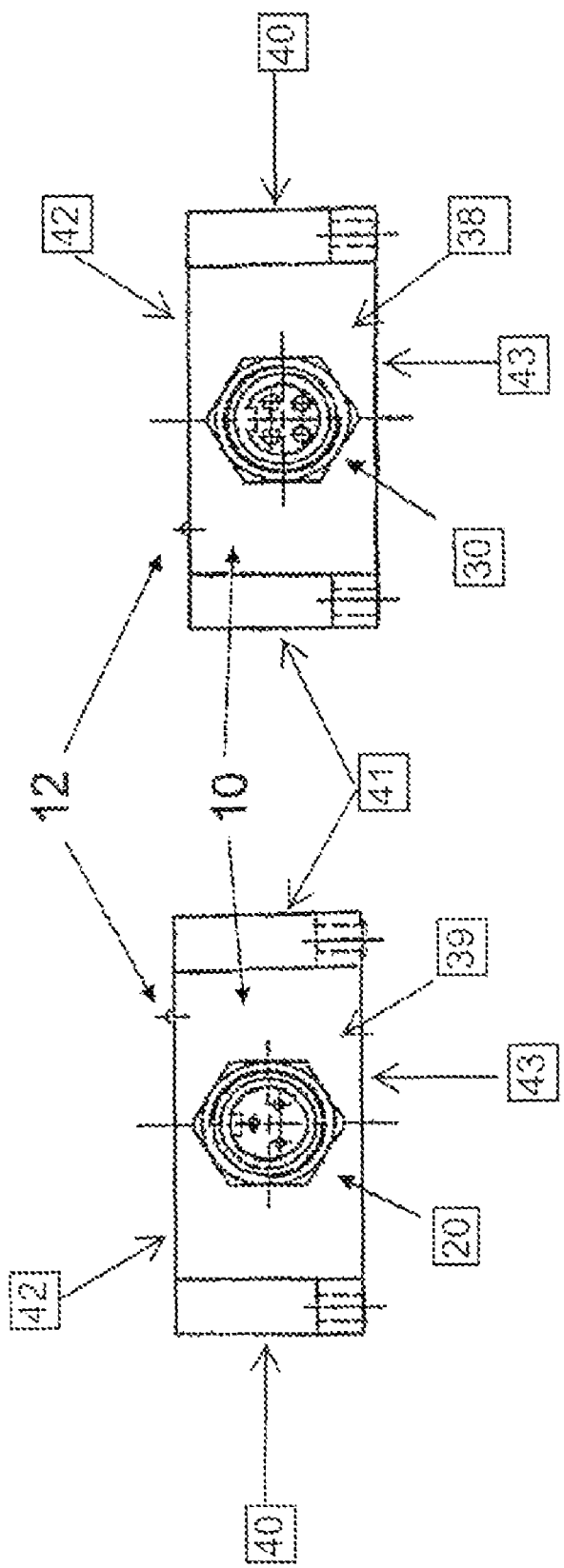

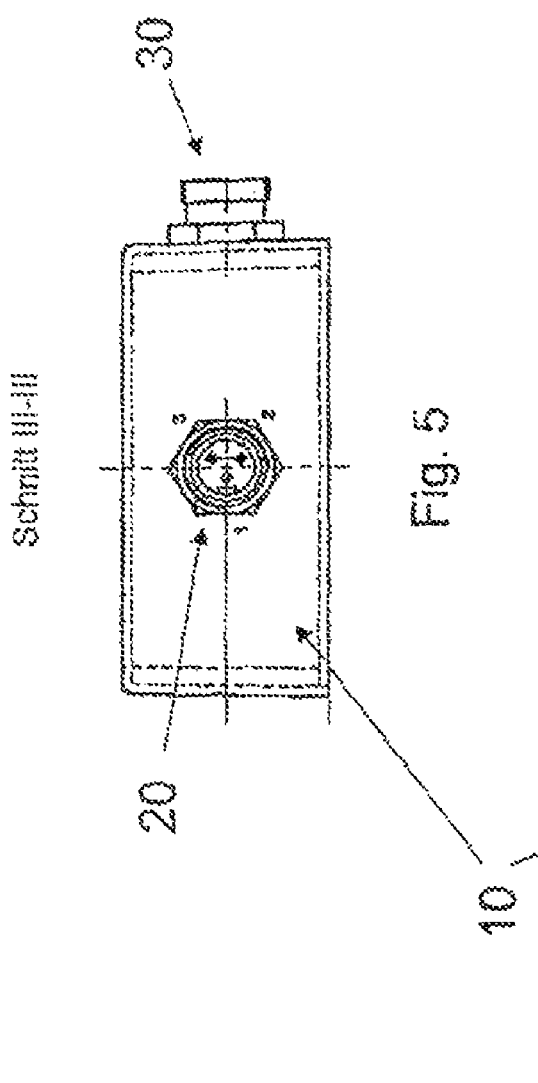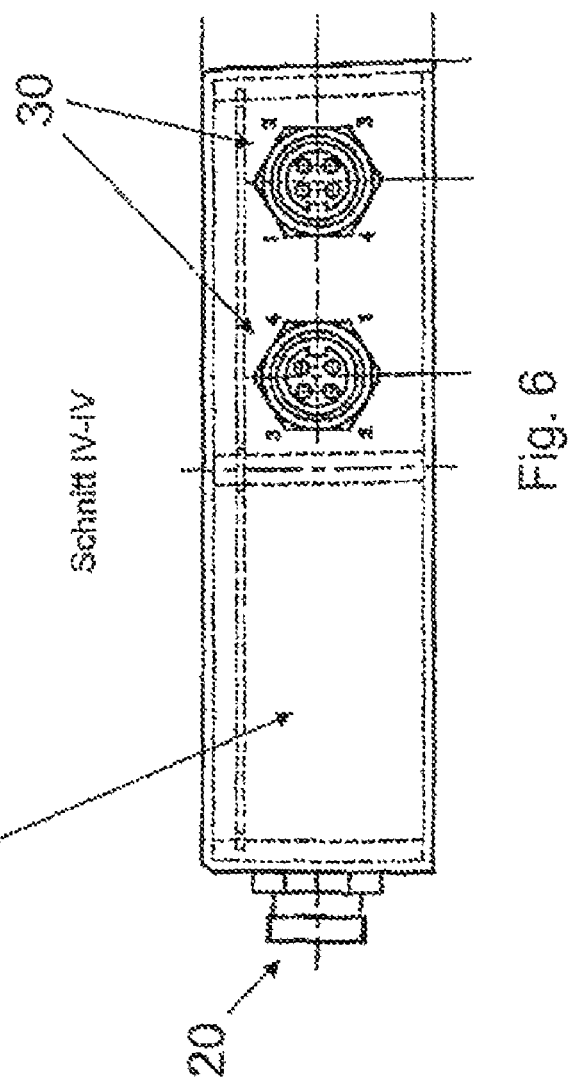

ASSEMBLY COMPRISING ELECTRIC AND/OR ELECTRONIC COMPONENTS

CROSS-REFERENCE TO RELATED APPLICATION

This application claims the benefit of the priority filing date of international application no. PCT/DE2007/001846, published on Jun. 5, 2008 which claims the priority to German application no. 10 2006 056 258.5 filed Nov. 27, 2006.

FEDERALLY SPONSORED RESEARCH

Not Applicable

SEQUENCE LISTING OR PROGRAM

Not Applicable

STATEMENT REGARDING COPYRIGHTED MATERIAL

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyright rights whatsoever.

BACKGROUND

The invention relates to a module of electric and/or electronic components, wherein the module is cast from a curable, electrically insulating casting compound in a housing.

In comparison with uncast modules, such cast modules have an increased resistance to environmental influences such as moisture, soiling, and vibration. At the same time, casting also provides electric insulation for the module. This insulation has a positive effect within the module. That is, the electric and/or electronic components contained therein can be arranged in closer proximity to one another without causing contact between the components due to vibration or other influences. Furthermore, because of the insulation, the module can more easily fit in a housing. Another positive effect of the casting is the passive cooling effect of the casting material achieved as a result of its favorable thermal conductivity.

The cast modules known in the art provides adequate protection of the module itself from the aforementioned environmental influences, but problems occur with the electric power supply and the delivery of electric current to the module. Electric contact with the module is usually established via contact legs which protrude from the module out of the cast block to an electric conductor or other electric device. It is difficult here to establish a reliable electric connection with the module, on the one hand, while, on the other hand, to reliably seal the contact legs protruding out of the cast block with respect to the environment.

If the module is to be connected to an electric conductor outside of a housing, it is usually accomplished by means of an opening formed in the housing through which the contact legs protrude outward. It is initially problematical when the casting material escapes from the opening immediately at the time of manufacture—when it is still in a liquid state. Therefore, casting is possible in practical terms only when the housing openings are situated at the top. This constitutes a substantial restriction in production in actual practice because all the housing openings must then be formed on the same side of the housing and must point upward during casting to prevent the casting compound from spilling out before it solidifies. In addition, the contact legs must be held in a suitable position to form an electric connection during casting, which makes the casting operation much more difficult. As a result, precise casting at the opening is required for an accurate design, making reliable sealing of the contact area difficult to implement, especially since the volume of the casting material changes upon solidification.

The object of the present invention is therefore to improve upon a module of the generic type such that it can be electrically connected reliably and without interference, largely independently of external environmental influences. At the same time, simple casting of the module in terms of the manufacturing technology would also be possible.

The object as defined above is achieved according to the invention by a module having the features of patent claim 1.

BRIEF SUMMARY OF THE INVENTION

The inventive module is characterized in that at least one terminal which is accessible from outside a housing and extends at least slightly into the housing is provided on the housing, establishing an electric connection to the module and being cast jointly with the module from the inside.

First, it has been recognized that in casting the module in a housing with a curable, electrically insulating material, it is difficult to electrically connect the module to other electric devices outside of the housing, in particular, with regard to sealing and with the restriction in arranging openings on the housing sides. To address these problems, an approach involving a simple design has been discovered whereby the inventive module is provided with at least one terminal that is accessible from outside the housing and extends at least slightly into the housing. This terminal may be a terminal element in general such as a plug element or a cable which can be screwed onto the housing, to which the housing is joined or which is otherwise connected to the housing. The connection may of course be designed with one or more poles. According to the invention, the connection is electrically connected to the module at any rate and is cast from the inside jointly with the module.

Through the inventive design, in which the connection from the interior of the housing is cast jointly with the module, casting of the module is made possible in an especially simple manner while achieving a secure sealing of the electric connection. The connection is therefore arranged at a suitable position on the housing so that the terminal is accessible from outside the housing. Since the terminal extends at least slightly into the housing—e.g., through an opening formed in the housing—the terminal can be connected electrically to the module introduced into the housing and cast together with the module from the inside. The casting material thus flows around the module with the electric and/or electronic components as well as the areas of the terminal situated inside the housing. Thus, after the casting material has solidified, extensive embedding and insulation of the module, on the one hand, and the housing part of the terminal, on the other hand, are guaranteed.

In a preferred embodiment, the terminal extends through an opening formed on the housing. It is conceivable that areas of the terminal protrude into the housing and/or extend outward of the housing.

The terminal may preferably be designed with regard to shape and/or size to seal the opening so that liquid casting material cannot escape from the opening. Furthermore, this prevents the entrance of foreign bodies and/or moisture into the housing. In addition, casting is possible as a result of this measure without any casting material escaping out of these openings, even when openings for the terminals are formed on different sides of the housing.

To achieve a convenient connection option, it is conceivable for the terminal to comprise a terminal element situated on the housing and an electric conductor, preferably a single pole or multiple pole cable, which can be connected to the terminal element. The terminal element is therefore embodied as a cable clamp or the like, preferably as a contact plug, thus resulting in an easily releasable connection. Alternatively, a soldered connection is also conceivable. The connection of the terminal of the electric conductor to the terminal element may thus be accomplished directly, i.e., by direct contact (cable clamp, soldered connection) or indirectly (contact plug).

The module and the terminal, in the connected state of the electric conductor to the terminal element, are expediently insulated electrically with respect to the environment. The insulation is provided by the housing walls, by an external shield for the terminal element, by the external shield for the electric conductor, and by the sealing of the connecting area between the terminal element and the electric conductor. It should be pointed out that the electric insulation of the components can be achieved only in the connected state of the electric conductor to the terminal element.

The terminal element itself may be attached to the inside of the housing to increase the sealing and insulating effects, preferably by screw connection. To do so, a thread may be formed in an area of the terminal element on the housing, so that a nut can be screwed onto it. Due to this screw connection, pressure of the terminal element against the housing can be achieved. Such an internal screw connection is advantageous because the solidified casting material then prevents unintentional release of the screw elements.

The electric conductor can be connected to the terminal element advantageously by means of a coupling element connected to it such as a contact plug or a jack. The terminal element and the coupling element are therefore expediently designed to be complementary to one another, in particular in the form of a plug-jack pair, so that repeated connection and disconnection are possible in a convenient manner. The terminal element here may have contact pins which fit into jacks on the coupling element and/or the coupling element may have contact pins which fit into jacks in the terminal element.

To prevent a mix-up with any other terminals that might be present, the coupling element and the terminal element may be unambiguously paired with one another in their design structure. Such a pairing may be accomplished, for example, by the arrangement and/or number of contact pins and/or jacks, or by the diameter or shape of the terminal element and the corresponding coupling element. In particular, when there are multiple terminals, such a pairing may prevent a mix-up of functionally different terminals.

To achieve a secure contact of the terminal element with the coupling element, it may be advantageous to secure this connection preferably in a form-fitting and/or nonpositive manner in the connected state. Such a securing means is conceivably a simple lock, snap connection, clamp, screw, bayonet or magnetic coupling.

In a preferred embodiment, the parts are secured by means of a screw connection, whereby an area of the terminal element and an area of the coupling element each have a suitably designed thread, such that a mutual screw connection is made possible. A screw connection with the module in question has the advantage of a strong sealing effect, in addition to securing the connection, due to the axial forces that occur with a screw connection acting at the points of contact of the thread. In addition, it is advantageous to provide seals, for example, in the form of sealing rings or washers, on the surfaces of the terminal element and the coupling element that come in contact. When using a screw connection, such sealing elements achieve a favorable sealing effect due to the axial forces.

Such a screw connection can be implemented in an advantageous design by arranging the thread of the terminal element and the thread of the coupling element coaxially around the electric contact area between the terminal elements and the electric conductor.

The connection can be designed in an especially advantageous manner, so that the coupling element comprises a coupling body and a union nut on which the thread of the coupling element is formed. The union nut is supported so it is rotatable with respect to the coupling body. However, its axial play with respect to the coupling body is limited, at least in the direction pointing toward the terminal element. The union nut may optionally be equipped with an inside thread or an outside thread, which engages the corresponding mating thread on the terminal element when the union nut is tightened. This joining technique allows, first of all, a mechanically secure sealing connection while also offering the special advantage of having the screw connection without having to turn the coupling body, so that no twisting of the electric conductor connected to it is produced when tightening or loosening the connection. In addition, the connection can be established with one hand, without the assistance of tools.

To facilitate the connection with one hand and to apply torque, the union nut may have a suitable external contour at least in some areas, preferably a grip area with a roughened surface, or an edge.

In another preferred embodiment, a tension relief device and/or a seal for the electric conductor connected to the coupling element is formed on the coupling element. Such a tension relief device and/or seal can be implemented in a simple manner in terms of the design due to the fact that the coupling element comprises a coupling body and a screw sleeve which is screwed onto the end of the coupling body facing the electric conductor such that the electric conductor extends axially through the screw sleeve into the coupling body. Clamping of the electric conductor to the coupling element may then be accomplished, for example, by the fact that the inside cross-section of the coupling body and/or the screw sleeve is reduced radially in at least some areas when the screw sleeve is tightened.

To allow simple casting of the module in the housing it is advantageous if, in addition to any openings provided for the terminal, there is at least one additional opening provided on the housing through which the casting material enters the housing. Such an opening may preferably be designed to be round and it is also conceivable to provide multiple openings for the casting material.

To enable the longest possible lifetime of the module, in particular even under unfavorable environmental influences such as vibration, extreme temperatures, pressures, moisture, etc., it is also good if the module is vacuum cast, preferably thermoselectively vacuum cast. In vacuum casting, the casting material is cast at a pressure lower than atmospheric pressure and the vacuum is eliminated after casting and before curing. The casting may be performed in an evacuable casting chamber. In this way, after casting with the casting material, the vacuum is eliminated so that the casting material is drawn properly into the evacuated interspaces between the electric and/or electronic components and the terminal in the housing. This largely prevents the development of air bubbles in the casting material. In addition, this ensures that the electric and/or electronic components, as well as the terminal, are completely surrounded by the casting material, thus yielding direct electric insulation. The components can then be arranged closer to one another due to the special electric insulation provided by the casting compound.

Especially good adhesion of the casting compound to the electric and/or the electronic components, on the one hand, and to the housing and the terminal, on the other hand, can be achieved in particular through thermoselective vacuum casting. To do this, the module is additionally heated before being cast—preferably together with the terminal and the housing—in particular being dried. The thermal treatment required for this may take place at a temperature range between 50° C. and approx. 80° C., preferably at 70° C. Furthermore, it is advantageous if this thermal treatment is performed over a period of 20 to 40 minutes, preferably 30 minutes. The thermal treatment is advantageously performed in a drying cabinet, from which the modules used in the housing and the terminal together with the housing can be brought together into a casting chamber. It is likewise conceivable the casting chamber is tempered and serves as a drying cabinet at the same time.

In a further advantageous manner, the module is brought to a casting temperature prior to casting, whereby it is to be assumed that the module that has previously been subjected to the thermal treatment is cooled or cools by itself due to the ambient temperature. Casting of the casting material is performed at a casting temperature of approx. 30° C. to 40° C. In a preferred embodiment, the module, the terminal plus the housing, and the casting material, are all at approximately the same temperature during casting. Furthermore, it should be assured that the blow surface tensions will prevail between the casting material, the module, the terminal and/or the housing, so that adequate adhesion in the cooled state can be expected.

It is essentially conceivable for multiple terminals to be provided on the housing. It is possible here to provide multiple terminals having the same function, e.g., to distribute electric power to multiple consumers. Alternatively or additionally, terminals could be functionally separate, e.g., by providing one or more terminals for the module's power supply and/or for the delivery of power to the module. Such a use of separate terminals for power supply and power delivery to the module might be appropriate if the module is a power pack, preferably a transformer or a switching network (primary switching controller, secondary switching controller). In particular, a terminal for electric power supply and a terminal for delivery of electric current to the module may be used here. It is fundamentally conceivable when using multiple terminals for them to be provided on different sides of the housing to achieve a functional separation of the terminals through the design and/or to achieve a favorable construction configuration.

There are various possibilities for embodying and refining the teaching of the present invention in an advantageous manner. On the one hand, reference may be made to the patent claims subordinate to patent claim 1, and on the other hand, to the following description of the two exemplary embodiments of the invention with reference to the drawings. In combination with the description of the preferred exemplary embodiments of the invention with reference to the drawings, generally preferred embodiments and refinements of the teaching will also be described.

FIGURES

FIG. 2 shows the module from FIG. 1 along section I-I;

FIG. 3 shows the module from FIG. 1 along section II-II;

FIG. 5 shows the module from FIG. 4 along section III-III;

FIG. 6 shows the module from FIG. 4 along section IV-IV.

DESCRIPTION

Figure 1:
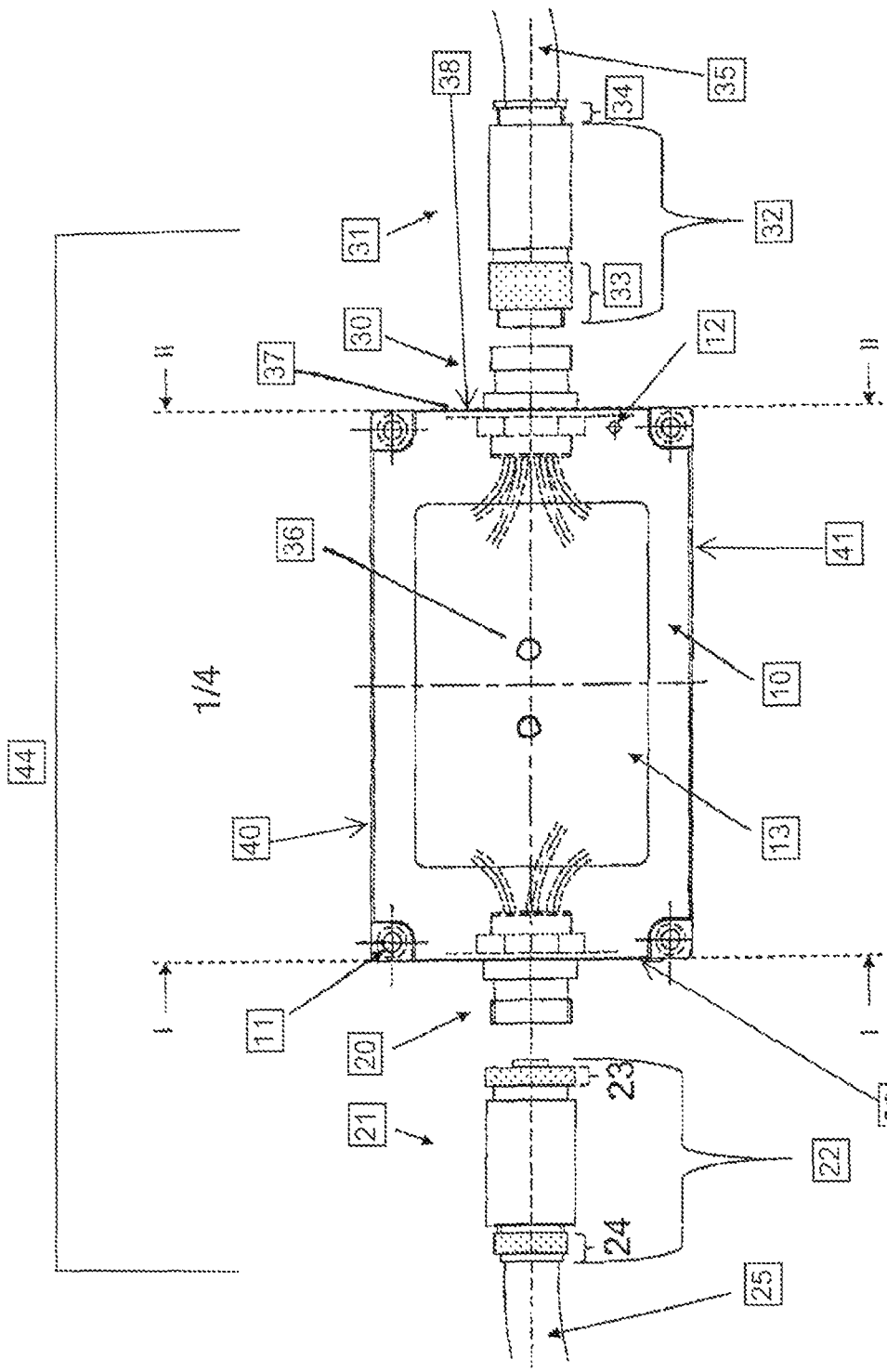
FIG. 1 shows a schematic view of a first exemplary embodiment of the inventive module.

The first exemplary embodiment of the inventive module is illustrated in FIG. 1, which shows a housing 10 cast in plastic and having a rectangular base area, which has four fastening boreholes 11 for attaching it to any object, e.g., a vehicle body part, a building wall.

A switching network part 13 embodied as a primary switching controller is situated in the housing and is electrically connected by cable (shown with dashed lines) to a terminal element 20 of the input and a terminal element 30 of the output. The terminal elements 20, 30 are ⅞" plug connectors designed with multiple poles, whereby the terminal element 20 of the input is embodied as a three-pole element to supply the switching network part 13 with alternating voltage (100-240 V) (see FIG. 2) and has an outside thread for connecting a complementary coupling element 21. The terminal element 30 of the output—likewise a ⅞" plug connector—is designed with four poles (see FIG. 3) for delivery of dc voltage (24 V) and has an inside thread for connection of a complementary coupling element 31. The two terminal elements 20, 30 extend through at least one opening 37 formed on the housing 10.

To prevent the wrong plug connections, the contact area of the terminal element 20 has a nose formed on the circumference, while the contact area of the terminal element 30 has a groove formed on the circumference. In addition, the asymmetrical arrangement of the contact pins (terminal element 20) and/or jacks (terminal element 30) prevents the wrong rotation of the coupling element 21 and/or 31 to be connected. Both terminal elements 20, 30 are made of a metallic base body on which an outside thread and/or an inside thread is formed for the coupling elements 21 and/or 31. The metallic base body of the terminal elements 20, 30 has a plastic core into which the contact pins and/or jacks are inserted. In addition, an outside thread is formed on the inside of the housing on the base body of the terminal elements 20, 30, serving to secure the terminal elements 20, 30 on each wall of the housing 10 by means of a lock nut.

A switching part 13, and the ends of the terminal elements 20 and 30 electrically connected to the switching network part 13 and protruding into the housing 10, are vacuum cast with a curable, electrically insulating casting material in the housing 10. For the vacuum casting, at least one other opening 36, preferably two circular openings are formed in the bottom side of the housing 10 along the central longitudinal axis of the housing 10. They are used in filling the housing with the casting material. The casting material contributes toward electric insulation and protection from mechanical stress, and is good for passive cooling of the primary switching controller.

The openings formed in the housing 10 of the terminal elements 20, 30 are sealed from the outside first by the nuts on the threads of the terminal elements 20 and 30 and also by the casting material which completely fills up the housing 10.

The electric conductors 25, 35 can be detachably connected to the terminal elements 20, 30 by means of the coupling elements 21, 31 designed as threaded coupling connectors. The coupling elements 21, 31 each comprise a coupling body 22, 32, a union nut 23, 33, which is rotatably supported on the coupling body 22, 32, and a screw sleeve 24, 34 that can be screwed onto the coupling body 22, 32. After attaching the coupling element 21, 31 to the corresponding terminal element 20, 30, the coupling element 21, 31 can be secured on the terminal element 20, 30 in a form-fitting and nonpositive manner by tightening the union nut 23, 33 on the thread of the terminal element 20, 30. The electric connection to the electric conductor 25, 35 is accomplished through contact pins and/or jacks which are designed to be complementary to the terminal element 20, 30 and are designed on the coupling body 22, 32 and are connected to the multipole electric conductor 25, 35 in the coupling body 22, 32. The electric conductor 25, 35 is held on the coupling body 22, 32 through clamping by means of the screw sleeve 24, 34.

During operation of the switching network part 13, an operating display 12, which is embodied as a light-emitting diode visible from outside the housing 10, indicates the operating state. All the components (the module, the housing and the terminals) are largely protected from foreign bodies and water (in the connected state) by being embodied in protection class IP67.

Figure 4:
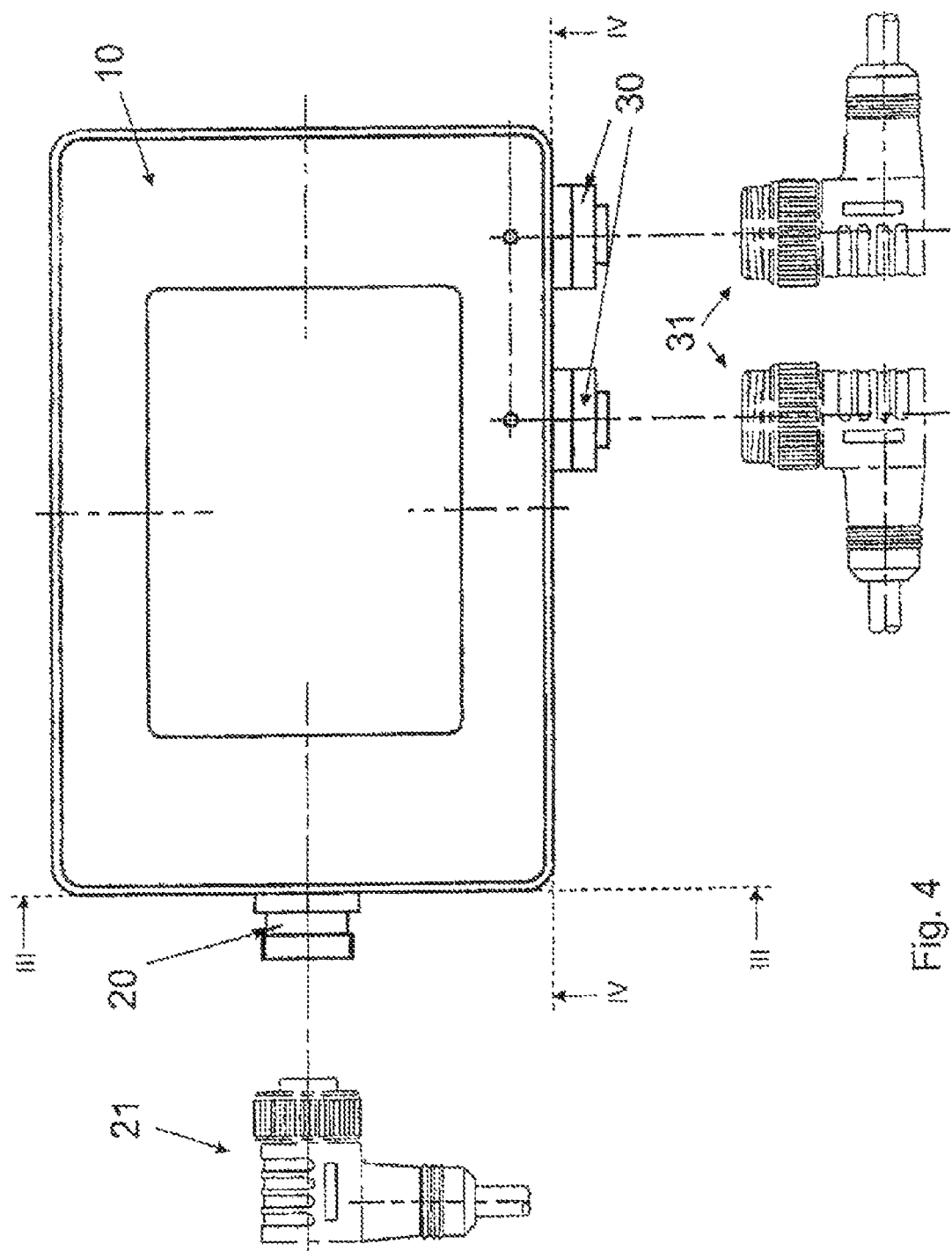
FIG. 4 shows a schematic view of a second exemplary embodiment of the inventive module.

A second exemplary embodiment of the inventive module is illustrated in FIG. 4. The module of the second exemplary embodiment corresponds in essential aspects to the module of the first exemplary embodiment, which is why reference is made to the corresponding passages for explanation. In contrast with the first exemplary embodiment, two terminal elements 30 of the output are embodied in pairs on the housing 10 in the second exemplary embodiment, as can be seen in FIG. 4. The terminal elements 30 of the output are arranged side-by-side on a side face of the housing 10 and are oriented opposite one another, as illustrated in FIG. 6. To reduce the space requirement of the entire module, the coupling elements 21, 31 have a coupling body bent at a right angle.

Finally, it should be noted that the exemplary embodiments mentioned above are given only to illustrate the claimed teaching which is not restricted to these exemplary embodiments.

I claim:

1. A module of electric or electronic components, wherein the module is cast with a curable electrically insulating casting material in a housing having a front wall, a back wall, a left side wall, a right side wall, a top side wall, and a bottom side wall, characterized in that at least one terminal element is provided on at least one of said walls of the housing which extends at least slightly into the housing through at least one opening formed on the housing, wherein the terminal element seals the opening while remaining accessible from outside the housing, and wherein the terminal element is electrically connected by cable to the module and is cast together with the module from inside the housing, and further characterized in that the module is thermoselectively vacuum cast and that at least one other opening is provided on at least one of said walls of housing through which the casting material can enter and fill out the housing completely.

2. The module according to claim 1, characterized in that the terminal element is arranged on the housing and an electric conductor is connected to the terminal element, and wherein the module and the terminal element in a connected state of the electric conductor to the terminal element can be electrically insulated with respect to its environment, wherein the terminal element can be attached, preferably by screw connection, inside of the housing.

3. The module according to claim 2, characterized in that the electric conductor can be connected to the terminal element by means of a coupling element connected thereto, wherein the terminal element and the coupling element can be designed to be complementary to one another, in particular in a form of a plug-jack pair, or wherein the coupling element and the terminal element can be unambiguously paired with one another through a male and female mating system, or wherein the coupling element can preferably be secured on the terminal element in a connected state in a form-fitting or nonpositive manner in particular by means of a lock, a snap connection, a clamp, a screw connection, a bayonet, a magnetic coupling.

4. The module according to claim 3, characterized in that securing is achieved by means of a screw connection whereby an area of the terminal element and an area of the coupling element each have a thread designed so that a mutual screw connection is made possible, wherein the thread on the terminal element and the thread on the coupling element can be arranged coaxially around an electric contact area between the terminal element and the electric conductor.

5. The module according to claim 3, characterized in that the coupling element comprises a coupling body and a union nut on which the thread of the coupling element is provided, whereby the union nut is rotatably supported with respect to the coupling body and whereby an axial play in the union nut with respect to the coupling body is limited at least in a direction facing toward the terminal element.

6. The module according to claim 5, characterized in that the union nut has a suitable outer contour, preferably a handle area with edgings for applying a torque.

7. The module according to claim 6, characterized in that the coupling element comprises a coupling body and a screw sleeve which is screwed an end of the coupling body facing the electric conductor, such that the electric conductor extends axially through the screw sleeve into the coupling body.

8. The module according to claim 7, characterized in that the electric conductor is clamped on the coupling element because of a radially diminishing inside cross section (in at least some areas) of the coupling body or the screw sleeve when the screw sleeve is tightened.

9. The module according to claim 3, characterized in that a tension relief device or a seal for the electric conductor connected to the coupling element is formed on the coupling element.

10. The module according to claim 1, characterized in that the at least one other opening through which the casting material can enter is round.

11. The module according to claim 1, characterized in that several terminal elements are provided on the housing.

12. The module according to claim 11, characterized in that the terminal elements are provided on different sides of the housing, preferably on opposite sides.

13. The module according to claim 1, characterized in that one or more terminals elements are provided to supply power to the module or for power delivery to the module.

14. The module according to claim 1, characterized in that the module is a power pack, preferably a transformer, a switching network part.

* * * * *